(12) United States Patent
Gotoh et al.

(10) Patent No.: US 7,563,342 B2
(45) Date of Patent: Jul. 21, 2009

(54) METHOD OF MANUFACTURING LAMINATED SUBSTRATE

(75) Inventors: Masashi Gotoh, Tokyo (JP); Hajime Kuwajima, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 485 days.

(21) Appl. No.: 11/407,057

(22) Filed: Apr. 20, 2006

(65) Prior Publication Data

US 2006/0237131 A1    Oct. 26, 2006

(30) Foreign Application Priority Data

Apr. 26, 2005    (JP) ............... 2005-127522

(51) Int. Cl.
*B32B 37/00* (2006.01)

(52) U.S. Cl. .................................. 156/307.7

(58) Field of Classification Search ............... 156/307.7
See application file for complete search history.

(56) References Cited

U.S. PATENT DOCUMENTS 4,370,187 A    1/1983    Katagiri et al.

FOREIGN PATENT DOCUMENTS

| EP | 0 300 787 A1 | 1/1989 |
|---|---|---|
| JP | 03-193317 | 8/1991 |
| JP | 10-190225 | 7/1998 |
| JP | 2001-203453 | 7/2001 |
| JP | 2002-15462 | 1/2002 |
| JP | 2003-124603 | 4/2003 |
| JP | 2004-98525 | 4/2004 |
| TW | 489589 | 6/2002 |
| TW | 512653 | 12/2002 |
| TW | 532050 | 5/2003 |
| TW | 562242 | 11/2003 |
| TW | 573332 | 1/2004 |
| TW | 123013 | 4/2005 |

*Primary Examiner*—Jeff H Aftergut
(74) *Attorney, Agent, or Firm*—Oblon, Spivak, McClelland, Maier & Neustadt, P.C.

(57) ABSTRACT

In a press process, a buffer member is placed on an RCC with a stainless steel plate between in such a way that the long sides and the short sides of the buffer member are aligned with the long sides and the short sides of the RCC respectively. The length of the long sides and the length of the short sides of the buffer member are designed to be smaller than the lengths of the long sides and the length of the short sides of the RCC respectively. With this feature, it is possible to reduce convexity on the RCC that is created in the peripheral region upon pressing the RCC to a core member.

6 Claims, 8 Drawing Sheets

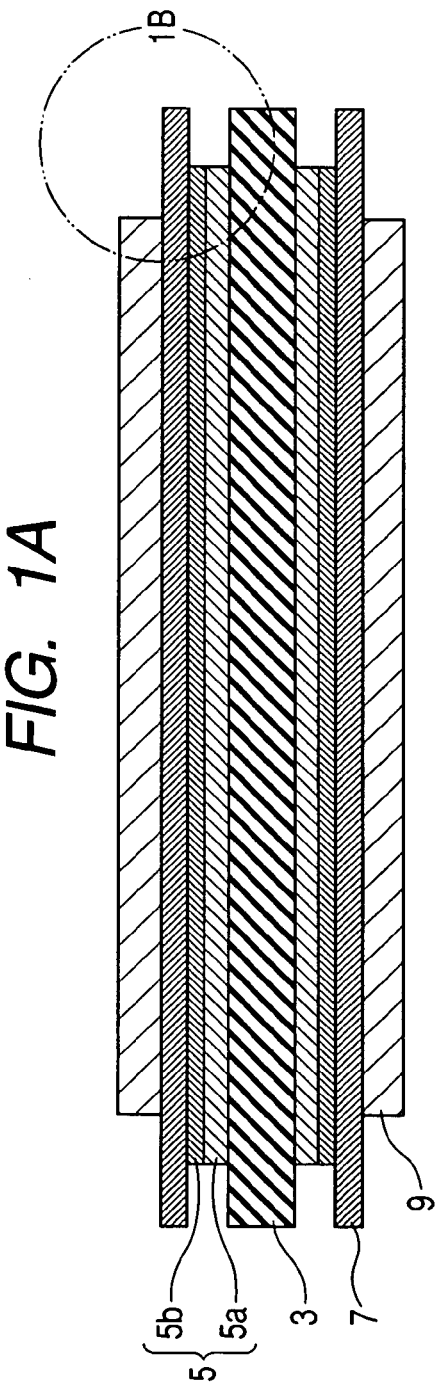
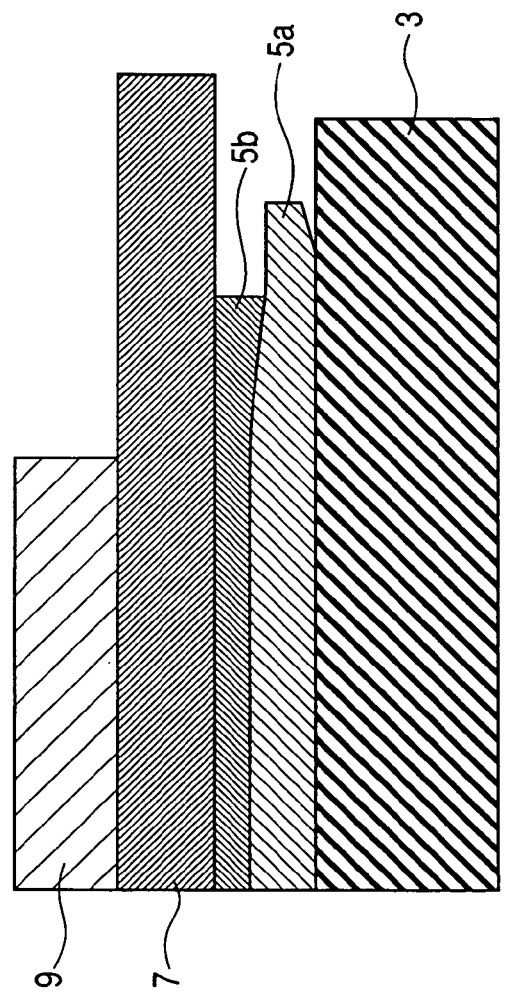

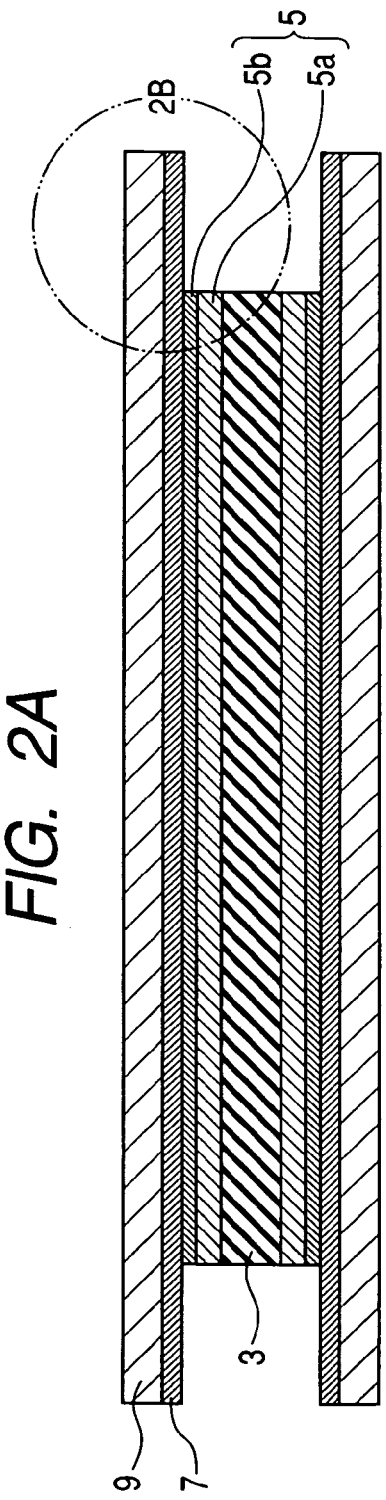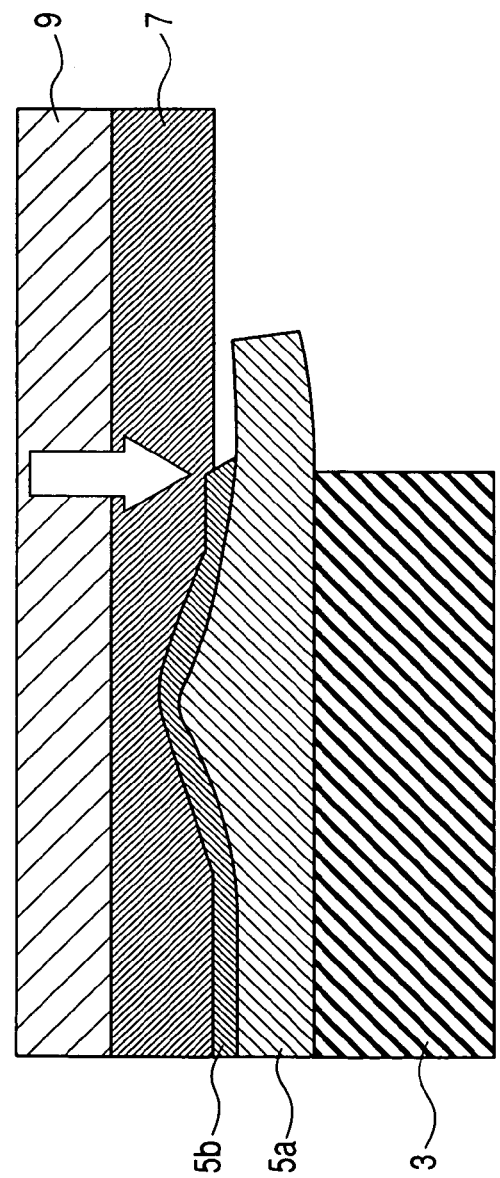

METHOD OF MANUFACTURING LAMINATED SUBSTRATE

BACKGROUND OF THE INVENTION

1. Field of the Invention

The present invention relates to an electronic part represented by a so-called multilayer wiring substrate produced by laminating metal foils on which resin is attached on both sides of a substrate and a method of manufacturing such an electronic part. More specifically, the present invention relates to a laminated substrate having excellent surface evenness that makes it possible to apply thereon post-processing such as polishing effectively and a method of manufacturing such a laminated substrate.

2. Related Background Art

An electronic part called a multilayer wiring substrate was developed in order to achieve high density in electronic apparatus. In the multilayer wiring substrate, various wiring which used to be provided on a printed circuit substrate is provided inside a laminated substrate to make it possible to achieve high density mounting. In a concrete manufacturing process, wiring and electrodes etc. are formed on the upper and lower surfaces of a substrate as a base member, a copper foil on which a resin layer as an insulating material is formed (that is, a resin coated copper, which will be referred to as RCC hereinafter) is laminated on the upper surface of the wiring and the electrodes etc. with the resin layer side facing that surface, the wiring and the electrodes etc. and the copper foil are brought into electrical contact and space formed between the substrate and the RCC is filled with the resin simultaneously, and thereafter a wiring pattern is formed on the copper foil. A multilayer wiring substrate inside which insulating layers having wiring etc. can be produced by performing the above described process repeatedly.

As disclosed for example in Japanese Patent Application Laid-Open No. 2003-124603, in the RCC lamination process, the RCC is not in direct contact with the substrate when it is pressed by pressurizing means for pressing. In the actual press process, an intermediate metal plate made of a stainless steel or the like and a buffer member in the form of a paper or silicon rubber sheet etc. is inserted between the RCC and the pressurizing means. Thanks to the presence of such members, more uniform pressure is effectively applied on the entire surface of the RCC. In connection with this, the buffer member is required to have cushioning properties, durability, releasability from a hot platen in some cases as mentioned in the above document and, in addition, sometimes required to have fluidity as disclosed in Japanese Patent Application Laid-Open No. 10-190225.

With downsizing and improvement of electronic parts in recent years, evenness of the surface of multilayer wiring substrates (or uniformity in the substrate thickness) has been demanded. Especially in the case where the multilayer wiring substrate is caused to function as a high precision electronic part by controlling the dielectric constant of the insulating layer or other factors, it is known that several micro meter variations of the insulating layer result in variations in properties of the electronic part. In view of this, methods of subjecting the substrate surface to processing such as polishing after completion of lamination to uniformize the substrate thickness mechanically have been adopted depending on the use.

For example, when a multilayer wiring substrate is produced by the method disclosed in the aforementioned Japanese Patent Application Laid-Open No. 2003-124603, it has been found that a bulge of a resin layer or a region in which the thickness of the insulating layer increases unevenly is formed in the neighborhood of the outer circumference of the substrate. The presence of such a region causes a difficulty in using the multilayer wiring substrate as it is after pressing and, in addition, affects the polishing process for making it even. In other words, it may lead to a difficulty in determining the reference surface in polishing and in improving the precision of polishing above a certain level and a decrease in the processing efficiency due to an increase in the polishing amount. Furthermore, when the number of laminated layers is increased, there is a possibility that the risk of positional displacement upon lamination increases if the lamination is performed on such a substrate as it is, or the laminating pressure is not applied on the substrate uniformly.

SUMMARY OF THE INVENTION

The present invention has been made in view of the above-described circumstances, and has as an object to provide a buffer structure for reducing variations in the in-plane thickness of a substrate or the like after press process for lamination, and more specifically to provide a buffer structure for reducing a bulging portion that is formed in the peripheral region of a substrate or the like. In other words, an object of the present invention is to provide a laminated substrate having excellent surface evenness and a method of manufacturing such a substrate.

To achieve the above object, according to the present invention, there is provided a laminated substrate manufacturing method for manufacturing a laminated resin substrate by laminating and pressing a metal foil with resin on a core substrate, the method comprising the steps of laminating the metal foil with resin on the core substrate while opposing the resin layer side of the metal foil with resin to a side of the core substrate, bringing a metal plate of a buffer structure formed by laminating a flat metal plate and a flat buffer member into contact with the surface of the metal foil with resin on which a resin layer is not formed, and pressing the metal foil with resin against the core substrate by applying pressure on the buffer member in the buffer structure, wherein the buffer member is disposed on the metal foil with resin with the metal plate between in such a way that the long side and the short side of the buffer member are aligned with the long side and the short side of the metal foil with resin, and the lengths of the the long side and the short side of the buffer member are equal to or shorter than the lengths of the long side and the short side of the metal foil with resin respectively.

In the above described laminated substrate manufacturing method it is preferred that the center of the plate-like shape of the metal foil with resin and the center of the plate-like shape of the buffer member substantially coincide with each other with respect to the direction of lamination.

Furthermore, to achieve the above described object, according to the present invention, there is provided a laminated substrate manufacturing method for manufacturing a laminated resin substrate by laminating and pressing a metal foil with resin on a core substrate, the method comprising the steps of, laminating the metal foil with resin on the core substrate while opposing the resin layer side of the metal foil with resin to a side of the core substrate, bringing a metal plate of a buffer structure formed by laminating a flat metal plate and a flat buffer member into contact with the surface of the metal foil with resin on which a resin layer is not formed, and pressing the metal foil with resin against the core substrate by applying pressure on the buffer member in the buffer structure, wherein the buffer member is disposed parallel to the metal foil with resin with the metal plate between, and the shape of the buffer member is designed in such a way that when the buffer member is projected onto the plane of the metal foil with resin along the direction of lamination, the projection of the buffer member extends beyond an edge of the metal foil with resin by an amount smaller than 2.5 mm or extends short of an edge of the metal foil with resin by an amount smaller than 5.5 mm.

In the above described laminated substrate manufacturing method it is preferred that the center of the plate-like shape of the metal foil with resin and the center of the plate-like shape of the buffer member substantially coincide with each other with respect to the direction of lamination.

Still further, to achieve the above described object, according to the present invention, there is provided a laminated substrate manufacturing method for manufacturing a laminated resin substrate by laminating and pressing a metal foil with resin on a core substrate, the method comprising the steps of laminating the metal foil with resin on the core substrate while opposing the resin layer side of the metal foil with resin to a side of the core substrate, bringing a metal plate of a buffer structure formed by laminating a flat metal plate and a flat buffer member into contact with the surface of the metal foil with resin on which a resin layer is not formed, and pressing the metal foil with resin against the core substrate by applying pressure on the buffer member in the buffer structure, wherein the buffer member is disposed parallel to the metal foil with resin with the metal plate between, and the ratio of the length of one side of the buffer member to the length of one side of the metal foil with resin falls within the range of 92% to 104%.

In the above described laminated substrate manufacturing method it is preferred that the center of the plate-like shape of the metal foil with resin and the center of the plate-like shape of the buffer member substantially coincide with each other with respect to the direction of lamination.

According to the present invention, it is possible to provide a laminated substrate having an excellent flatness or evenness while allowing to control the thickness of an insulating layer on the order of micrometers. Therefore, even if for example a polishing process is added after a press process, the polishing amount can be reduced, the polishing process can be simplified and the precision of polishing can be enhanced. Conventional processes suffer from convex region of resin material layer formed in the peripheral of the substrate due to concentration of load in the plane of the substrate during the press process. According to the present invention, it is possible to prevent such concentration of load. Consequently, it is possible to reduce and uniformize a partial load applied on the substrate.

The above and other objects, features, and advantages of the invention will become more apparent from the following detailed description of taken in conjunction with the accompanying drawings.

BRIEF DESCRIPTION OF THE DRAWINGS

FIG. 1A schematically shows a buffer structure according to an embodiment of the present invention.

FIG. 1B is an enlarged view showing portion 1B in FIG. 1A.

FIG. 2A schematically shows a conventional buffer structure.

FIG. 2B is an enlarged view showing portion 2B in FIG. 2A.

DETAILED DESCRIPTION OF THE PREFERRED EMBODIMENT

Figure 3:
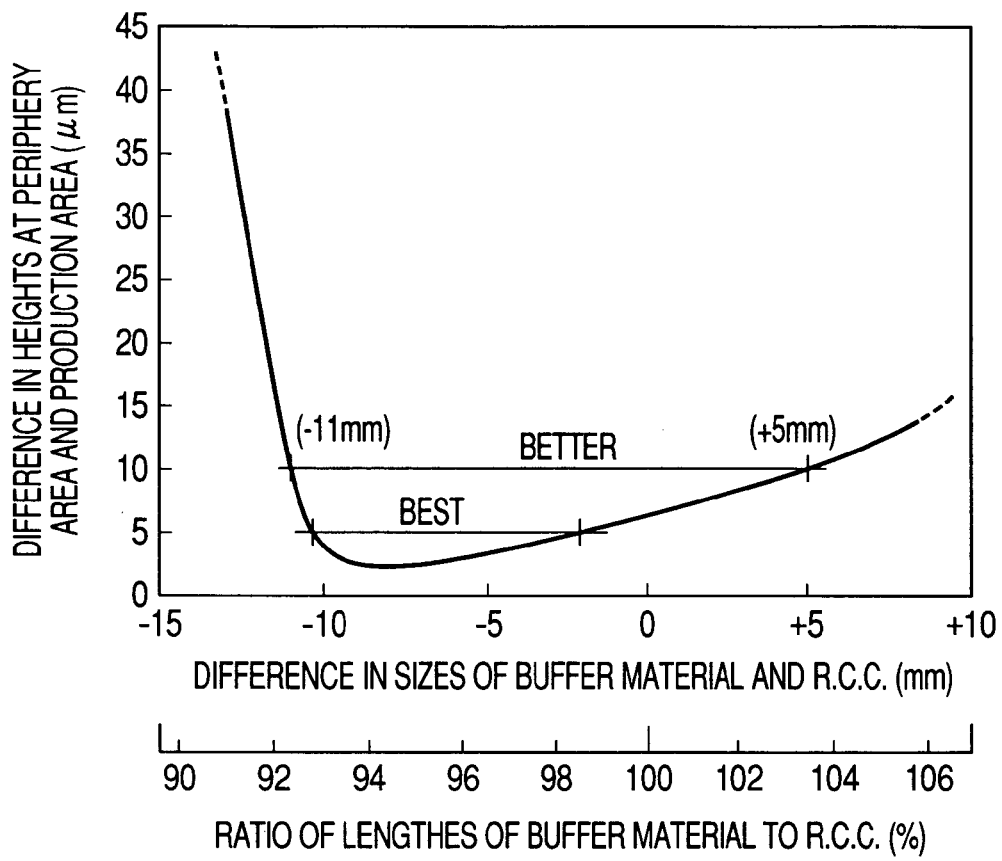
FIG. 3 shows differences in the product height between the outer periphery and the product area while changing the size of the buffer member relative to the size of the RCC.

In the following, an embodiment of the present invention will be described with reference to the accompanying drawings.

FIGS. 1A and 1B show a buffer structure in a press process according to an embodiment of the present invention, wherein the lamination state of buffer members, a substrate and RCCs etc. is shown in a cross section. FIG. 1A shows the entire structure, and FIG. 1B is an enlarged view showing a region 1B indicated in FIG. 1A. In the press process, RCCs 5, stainless steel plates 7 and buffer members 9 are laminated in the mentioned order on both surfaces of a thin plate-like substrate 3 at the center, and press plates (see FIG. 4) of a press machine are placed outside them. The RCC 5 is formed by laminating a copper foil 5b and a resin layer 5a, and it is oriented in such a way that the resin layer 5a side faces the substrate 3. The substrate 3 serves as a core substrate, the RCC 5 serves as a metal foil with resin (that is, a metal foil on which resin is attached), the stainless steel plate 7 serves as a metal plate, and the buffer member 9 serves as a buffer member. The stainless steel plate 7 and the buffer member 9 are laminated to serve as a buffer structure.

For comparison, a conventional buffer structure is shown in FIGS. 2A and 2b in a similar manner as FIGS. 1A and 1B. In FIGS. 2A and 2B, elements similar to those in FIGS. 1A and 1B will be designated by the same reference numerals. In the press process, the load applied by the press plates (not shown in FIGS. 1A and 1B) is-transmitted to the plate members 7 made of a rigid metal such as stainless steel through the buffer members 9. A load is applied to the RCC 5 and other members to be pressed through this plate member 7 (which will be hereinafter referred to as the stainless steel plate 7). As shown in FIG. 2A, in the conventional process, the stainless steel plate 7 and the buffer member 9 have substantially the same size that is significantly larger than the RCC 5.

In such a conventional buffer structure, bulging of the resin layer 5a toward the stainless steel plate 7 occurs at a position corresponding to the outer periphery of the substrate 3, as shown in FIG. 2B. The inventor researched the reason why such a phenomenon occurs, and discovered that concentration of stress occurs at the edge portion of the RCC5. Specifically, a load applied by the press plate is also transmitted to a region on the buffer member 9 that is bordered by the edge of the RCC 5 and on which the RCC 5 is not present, and a part of the load applied to the portion that would originally be supposed to constitute a free end for the load is applied to that border. When the RCC 5 is pressed against the substrate 3 in the press process, the resin layer 5a is pressed by electrodes etc. (not shown) present on the substrate 3 and moves, and superfluous resin escapes from the upper surface of the substrate to the outside. However, since an excessive load is applied on the edge portion of the RCC 5, the superfluous resin cannot escape to the outside but extends to the thickness direction. As a result, a convex region is created. In addition, the thermal conductivity of that region is increased by concentration of load, and it is considered that hardening of the resin will progress preferentially in that region. If this is the case, escape of the resin is also blocked by the hardened portion, and the effect of forming the convex portion is promoted by the interaction of the flow of the resin toward the outside and the flow of the resin moved back by the hardened portion.

In view of the above, it is considered that creation of the convex portion can be prevented by eliminating concentration of load at the edge portion of the RCC 5. Therefore, in the present invention, the size of the buffer member 9 is made smaller than the RCC 5 as shown in FIG. 1A to eliminate application of load to the portion of the stainless steel plate 7 that corresponds to the edge portion of the RCC 5. With this feature, in the case where a reaction force acting on the stainless steel plate 7 from the RCC 5 upon application of pressing load is large, the stainless steel plate 7 can move toward the press plate, whereby concentration of load to the edge portion of RCC 5 can be prevented more effectively. Consequently, the resin layer 5*a* can flow toward the outside of the substrate 3 easily, and superfluous resin can be allowed to escape toward the outside of the substrate. Thus, it is possible to prevent formation of a convex portion.

In connection with the above, in the case where the size of the buffer member 9 is excessively small as compared to the size of the RCC 5, there is a possibility that RCC 5 cannot be pressed against the substrate 3 sufficiently. If this is the case, contact of the RCC 5 to the substrate 3 in the periphery of the substrate 3 is deteriorated, and buildup of the outwardly flowing resin occurs to cause an increase in the thickness of the resin layer in the region in which the buffer member 9 is not present. In view of this, we determined the difference in the resin thickness (or the height of the product) between the product area corresponding to the central portion of the RCC and the outer peripheral area for buffer members having various sizes relative to the RCC. The result is shown in FIG. 3.

It will be understood from FIG. 3 that in the range in which the buffer member is small, a large convex portion is present at the outer peripheral area, and the height of the convex portion becomes smaller as the size of the buffer member is increased, and the height of the convex portion becomes minimum at a certain point and increases as the size of the buffer member is further increased. From this follows that by designing the size of the buffer member to have a value within the range of −11 mm to +5 mm relative to the size of the RCC as indicated in FIG. 3, or by designing the size of the buffer member to have a ratio (i.e. the ratio of the buffer member size and the RCC) within the range of 92% to 104%, it is possible to make the height difference in the product lower than 10 μm. Furthermore, it is possible to make the height difference in the product lower than 5 μm by designing the size of the buffer member to have a value within the range of −10.5 mm to −2 mm relative to the size of the RCC, or by designing the size of the buffer member to have a ratio (i.e. the ratio of the buffer member size and the RCC) within the range of 93% to 99%. In other words, it was discovered that it is possible to obtain a wiring substrate having excellent evenness by designing the size of the buffer member relative to the RCC to meet the above mentioned relationship.

By further studying the result shown in FIG. 3, it will be understood that it is possible to control the height of the convex portion by designing the shape or size of the buffer member 9 in such a way that when the buffer member 9 is projected on the plane of the RCC5 along the lamination direction, its edge extends beyond the edge of the RCC 5 by an amount smaller than 2.5 mm or extends short of the edge of the RCC 5 by an amount smaller than 5.5 mm. The aforementioned values 2.5 mm and 5.5 mm are obtained by considering the aforementioned values +5 mm and −11 mm that concerns the entire length of the buffer member for only one of its edges. For the same reason, more preferred values are −5.3 mm and −1.0 mm respectively.

In considering the ratio of the length of the buffer member 9 and the length of the RCC 5, it is preferred that the buffer member 9 be disposed parallel to the RCC 5 with the stainless steel plate 7 between, and the ratio of the length of one side of the buffer member 9 to the length of one side of the RCC 5 falls within the range of 92% to 104%. The values of the ratio may change depending on various factors such as the fluidity of the resin, the hardening temperature of the resin, the thickness of the resin layer, the thickness and material of the buffer member, the stiffness of the rigid metal plate. Therefore, to control variations in the height of the product appropriately, it is preferred that the size of the buffer member be nearly equal to or smaller than the size of the RCC by an amount smaller than 11 mm, or the size of the buffer member be larger than or equal to 93% of the size of the RCC. In other words, in the present invention, the buffer member 9 is disposed on the RCC 5 with the stainless steel plate 7 between in such a way that the long and the short sides of the buffer member 9 are arranged respectively parallel to the long and the short sides of the RCC 5, and the long and the short sides of the buffer member 9 are designed to be shorter than or equal to the long and the short sides of the RCC 5 respectively.

Figure 4:
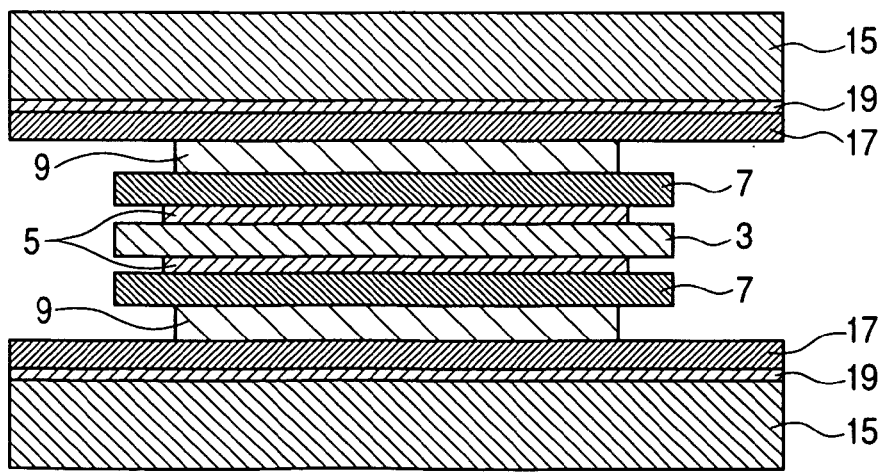
FIG. 4 schematically shows the principal portion of a press apparatus in an embodiment of the present invention.

In the following, results of measurements performed on some embodiments of the present invention will be described. FIG. 4 schematically shows a buffer structure used for carrying out the invention and the relevant portion of a press apparatus in which the buffer structure is used. The elements same as those in the above described embodiment are designated by the same reference signs, and detailed description thereof is omitted. Between a pair of hot press plates 15 that were arranged parallel in the press apparatus, there was provided a substrate 3 shown in FIG. 1A, a pair of RCCs 5 disposed to sandwich the substrate 3, a pair of stainless steel plates 7 disposed on the outer sides of the RCC 5, and a pair of buffer members 9 disposed on the outer sides of the stainless steel plates 7. The pressure applied on the RCC and other members upon pressing was 40 kg/cm². During pressing, the process temperature was maintained at 150° C. for an hour and thereafter maintained at 200° C. for three hours to harden the resin layer. The pressing was performed in a decompressed ambient with a degree of vacuum lower than 30 Torr.

On the surface of the hot press plate 15 was provided a fluorine-based sheet 17 for preventing attachment of the buffer member 7 to the surface of the hot press plate 15 and compensating unevenness of the surface of the hot press plate 15 by means of a fluorine-based sheet support board 19. The temperature of the hot press plate 15 can be controlled by using a thermal medium or the like, so that in the press process, the RCC and other members can be pressed at a desired temperature. In the actual press process, the substrate 3 and the RCC 5 were held between the hot press plates 15 for a predetermined time period to heat them to a predetermined temperature, and thereafter the RCC 5 and the substrate were bonded together by pressing them between the hot press plates 15 at a constant pressure.

With the apparatus having the above described structure, buffer members 9 made of paper having different sizes were prepared, and the thickness of the resultant laminated substrate were measured at positions along the diametric direction thereof. FIGS. 5A to 5D show the measurement results. The size of the RCC 5 was 134 mm×134 mm, the size of the stainless steel plate 7 was 134 mm×134 mm, and the thickness thereof was 1 mm. In each graph, a numeral indicating the dimension of the side of the rectangular buffer member 9 is presented. Namely, FIGS. 5A to 5D show the measurement results for buffer members 9 having dimensions of 136 mm, 133 mm, 130 mm and 127 mm respectively. The smaller square frame in each of FIGS. 5A to 5D represents the area that will be cut out and used as a product, and the larger square frame represents the area over which the RCC is disposed.

Figure 5A:
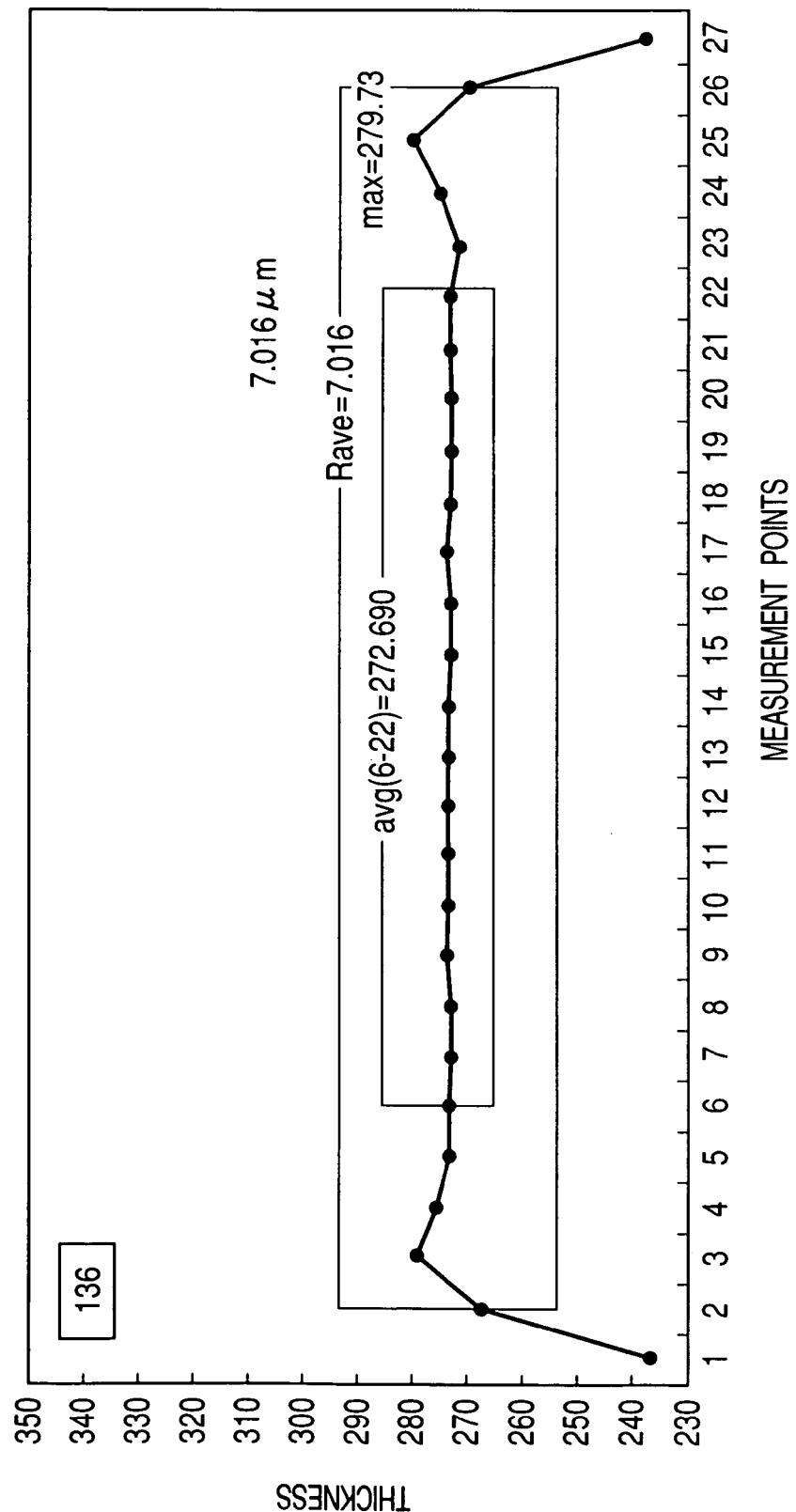
FIG. 5A shows changes in the thickness of a resin layer on a substrate when the size of the buffer member is changed.
Figure 5B:
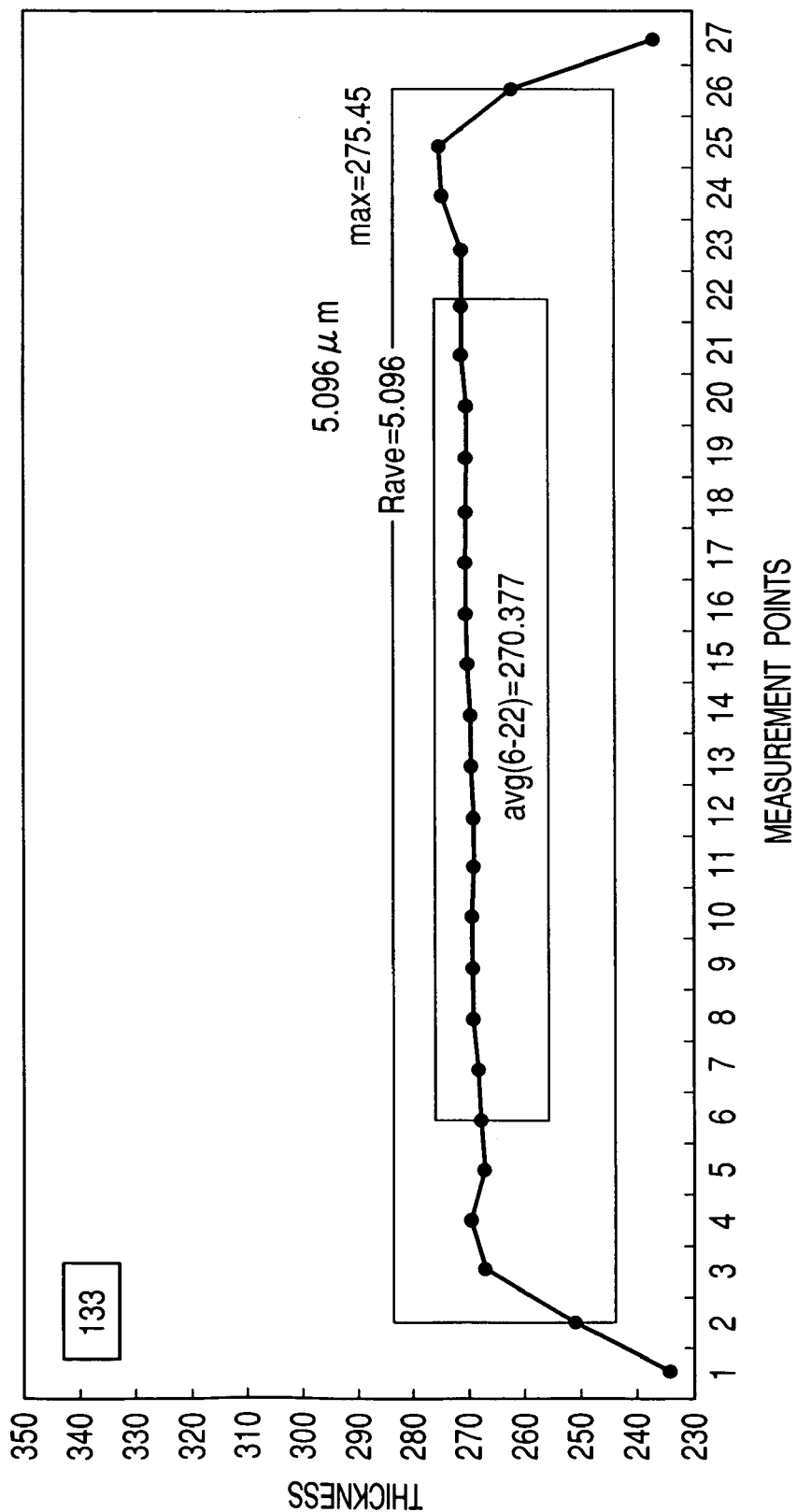
FIG. 5B shows changes in the thickness of a resin layer on a substrate when the size of the buffer member is changed.
Figure 5C:
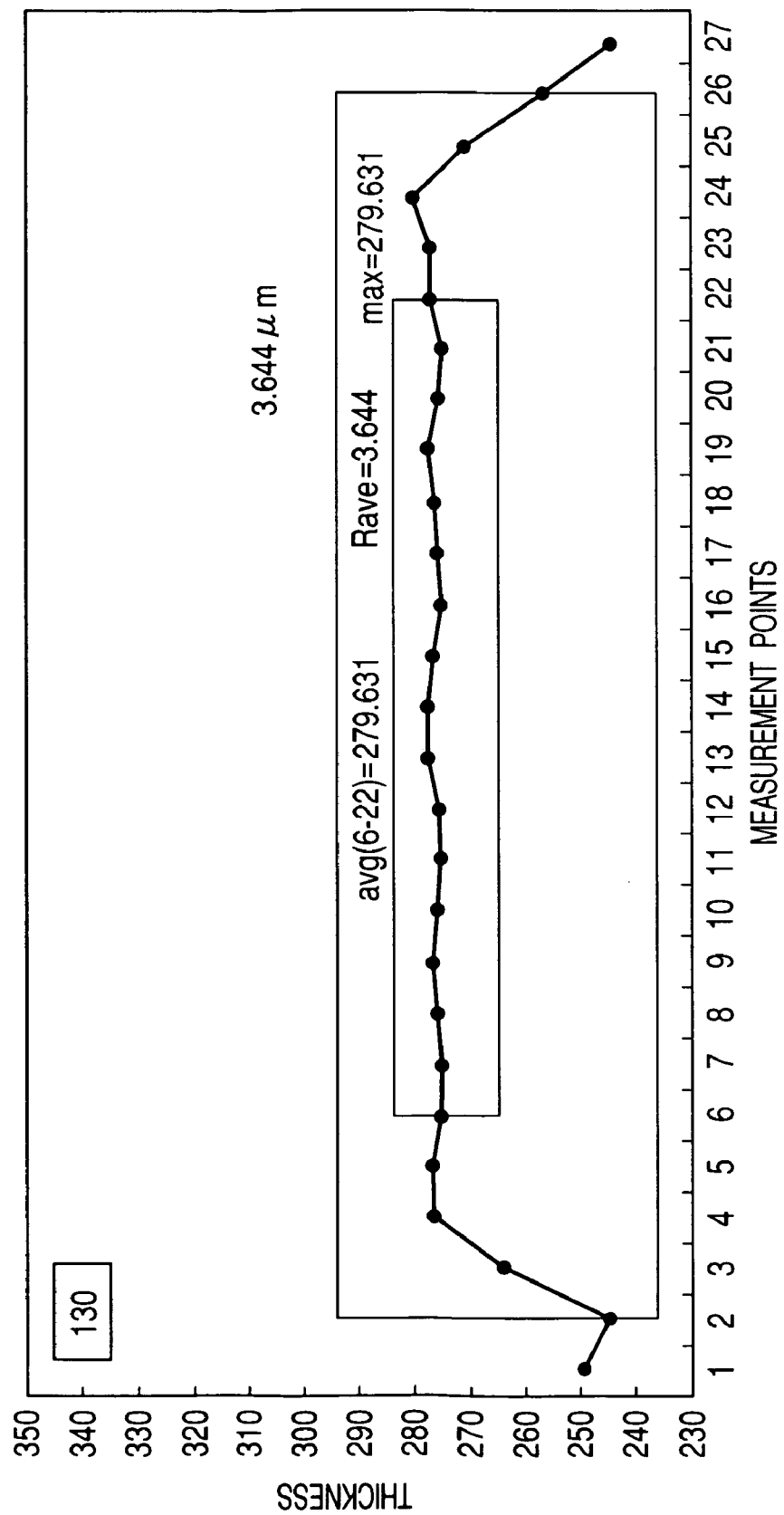
FIG. 5C shows changes in the thickness of a resin layer on a substrate when the size of the buffer member is changed.
Figure 5D:
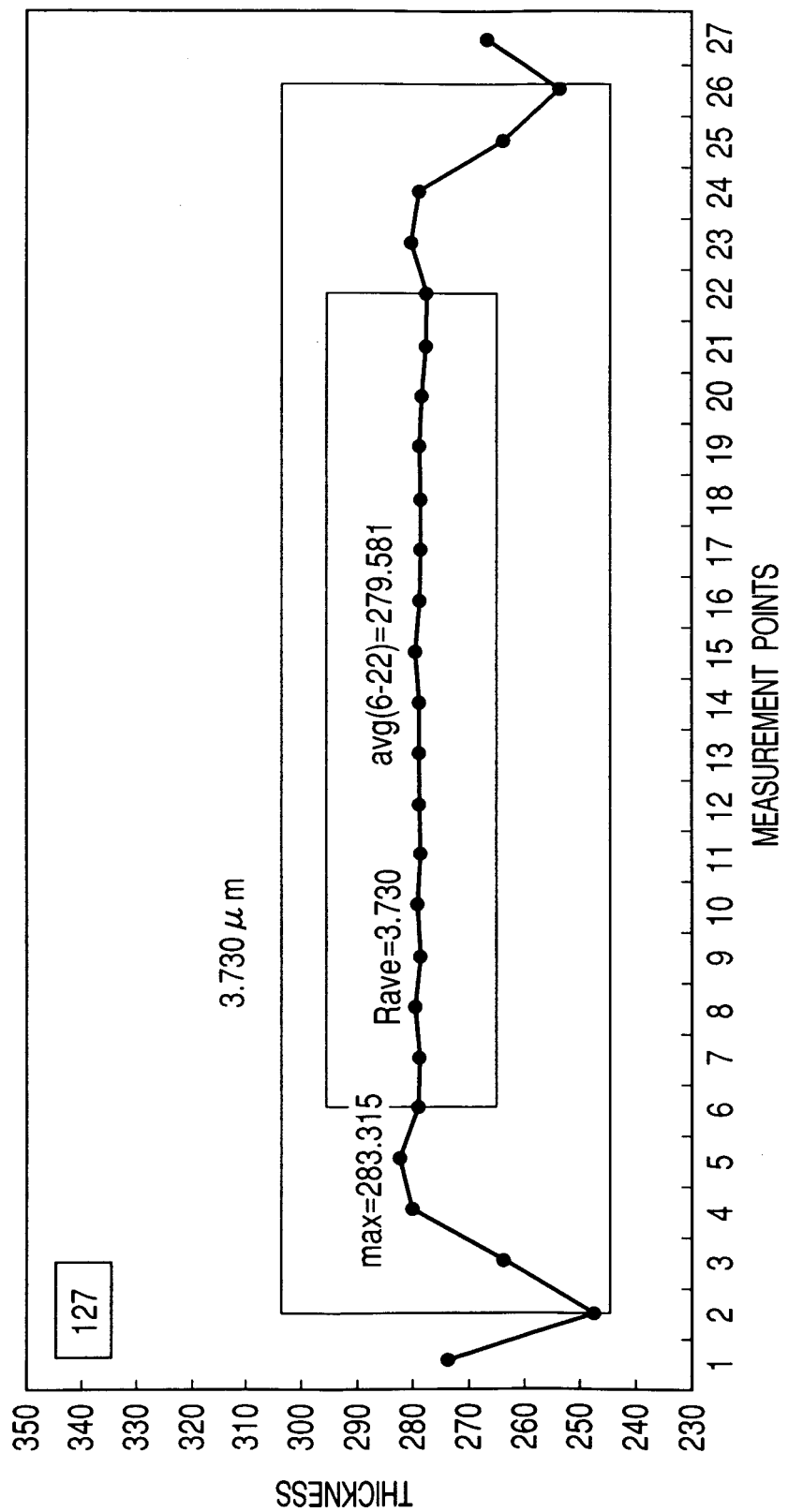
FIG. 5D shows changes in the thickness of a resin layer on a substrate when the size of the buffer member is changed.

In the case of FIG. 5A where the size of the buffer member 9 is larger than the RCC 5, a convex region definitely exists in the periphery. It will be understood that the height of the top of the convex region becomes smaller as the size of the buffer member 9 decreases, namely as the condition changes from FIG. 5A, to FIG. 5B, to FIG. 5C and to FIG. 5D. It will also be understood that as the condition changes from FIG. 5C to FIG. 5D, the area in which satisfactory bonding has not been achieved due to insufficiency of the load applied is increasingly generated in the neighborhood of the outer periphery of the RCC.

Figure 6:
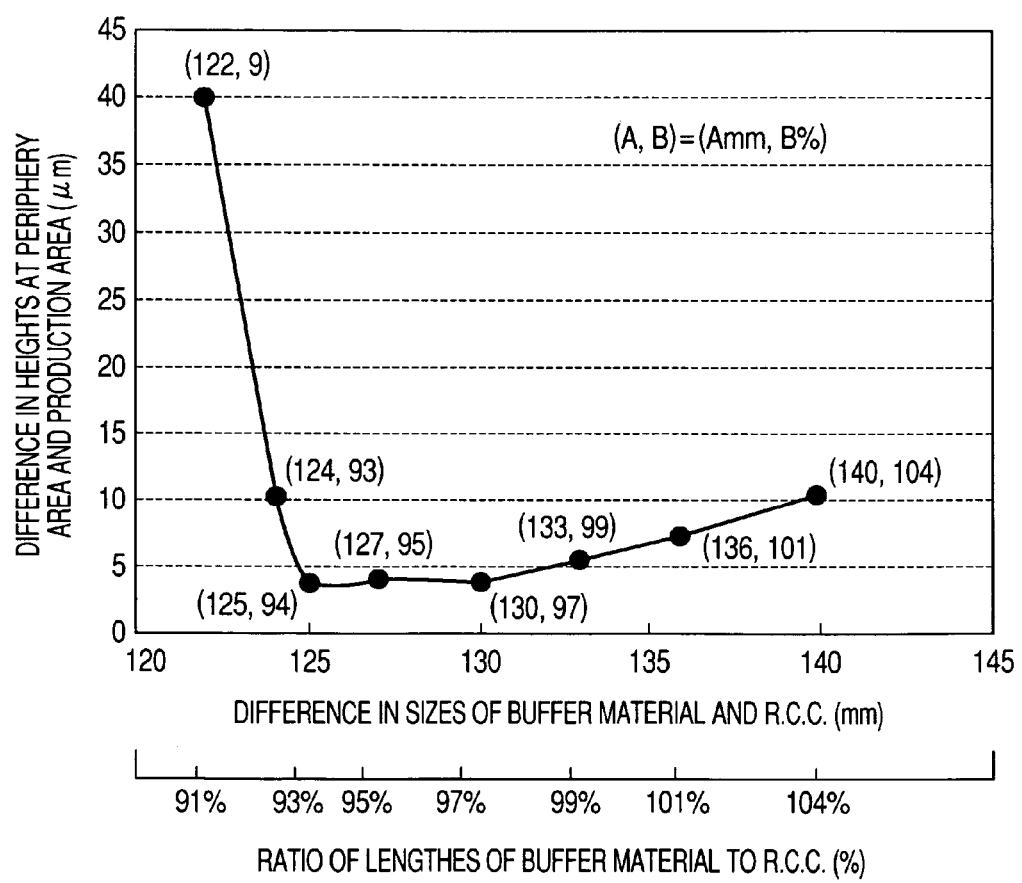
FIG. 6 shows differences in the product height between the outer periphery and the product area while changing the size of the buffer member relative to the size of the RCC, where the samples same as those used in FIGS. 5A to 5D and some additional samples were used.

Further experiments were conducted with the above described samples of the buffer member and additional samples. The results are shown in FIG. 6 as a graph. As will be understood from FIG. 6, if the size of the buffer member is designed appropriately, or designed to be nearly equal to or smaller than the size of the RCC and pressing is performed in the state in which the center of the buffer member and the center of the RCC are aligned, it is possible to bond the substrate 3 and the RCC 5 without forming a convex portion in the peripheral area. In FIG. 3 that was referred to in connection with the previous embodiment and FIG. 6, the dimensions and the ratios refer to the entire size. Accordingly, when only one of the edge is concerned, those values should be reduced to half.

Although a stainless steel plate 7 is used as a rigid metal plate in the above embodiment, the use of the stainless steel plate is not essential to the present invention. Although a buffer member made of paper is used, the advantageous effects of the present invention are also achieved even when ordinary buffer materials such as rubber are used as the buffer member. In addition, a film or a metal foil (not shown) for preventing attachment of resin may be provided between the metal foil side of the RCC and the stainless steel plate. The structure of the hot press plate 15 etc. may be modified in various ways as conventionally known.

The present invention is mainly directed to a process of laminating or bonding an RCC on a substrate. However, the present invention can also be applied to a process of bonding substantially flat plate-like members to each other with adhesive by pressing those members.

As many apparently widely different embodiments of the present invention can be made without departing from the spirit and scope thereof, it is to be understood that the invention is not limited to the specific embodiment thereof except as defined in the appended claims.

This application claims priority from Japanese Patent Application No. 2005-127522 filed Apr. 26, 2005, which is hereby incorporated by reference herein.

What is claimed is:

1. A laminated substrate manufacturing method for manufacturing a laminated resin substrate by laminating and pressing a resin-metal foil, wherein said resin-metal foil is planar, has a first side longer than a second side, and includes a resin layer formed on a metal foil, on a planar core substrate such that a resin layer side of the resin-metal foil contacts the planar core substrate, the method comprising:

laminating said resin-metal foil on said planar core substrate while opposing the resin layer side of said resin resin-metal foil to a side of said planar core substrate;

bringing a flat metal plate portion of a buffer structure, said buffer structure formed by laminating a flat metal plate and a planar buffer member having a first side longer than a second side, into contact with a surface of said resin-metal foil on which a resin layer is not formed; and pressing said resin-metal foil against said planar core substrate by applying pressure on said planar buffer member in said buffer structure, wherein said planar buffer member is disposed on said resin-metal foil with said metal plate between in such a way that the first side and the second side of the said planar buffer member are aligned with the first side and the second side of said resin-metal foil, the lengths of the said first side and said second side of said planar buffer member are equal to or shorter than the lengths of said first side and said second side of said resin-metal foil respectively, said flat metal plate brought into contact with the resin-metal foil has a larger surface area than a surface area of the surface of said resin-metal foil on which a resin layer is not formed, and an area of said flat metal plate corresponding to an edge of said resin-metal foil is unobstructed by the buffer on a side contacting the buffer and is moveable in a direction opposite to which the buffer presses the metal plate upon receipt of force from said edge of said resin-metal foil.

2. A laminated substrate manufacturing method according to claim 1, wherein a center of said resin-metal foil and a center of said planar buffer member substantially coincide with each other with respect to a direction of lamination.

3. A laminated substrate manufacturing method for manufacturing a laminated resin substrate by laminating and pressing a resin-metal foil, wherein said resin-metal foil is planar and includes a resin layer formed on a metal foil, on a planar core substrate such that a resin layer side of the resin-metal foil contacts the core substrate, the method comprising:

laminating said resin-metal foil on said planar core substrate while opposing the resin layer side of said resin-metal foil to a side of said planar core substrate;

bringing a flat metal plate portion of a buffer structure, said buffer structure formed by laminating a flat metal plate and a planar buffer member, into contact with a surface of said resin-metal foil on which a resin layer is not formed; and pressing said resin-metal foil against said planar core substrate by applying pressure on said planar buffer member in said buffer structure, wherein said planar buffer member is disposed parallel to said resin-metal foil with said metal plate between, and the shape of said buffer member is configured in such a way that when said buffer member is projected onto the plane of said resin-metal foil along a direction of lamination, a projection of said buffer member extends beyond an edge of said resin-metal foil by an amount smaller than 2.5 mm or extends short of an edge of said resin-metal foil by an amount smaller than 5.5 mm, said flat metal plate brought into contact with the resin-metal foil has a larger surface area than a surface area of the surface of said resin-metal foil on which a resin layer is not formed, and an area of said flat metal plate corresponding to an edge of said resin-metal foil is unobstructed by the buffer on a side contacting the buffer and is moveable in a direction opposite to which the buffer presses the metal plate upon receipt of force from said edge of said resin-metal foil.

4. A laminated substrate manufacturing method according to claim 3, wherein a center of said resin-metal foil and a center of said buffer member substantially coincide with each other with respect to the direction of lamination.

5. A laminated substrate manufacturing method for manufacturing a laminated resin substrate by laminating and pressing a resin-metal foil, wherein said resin-metal foil is planar and includes a resin layer formed on a metal foil, on a planar substrate such that a resin layer side of the resin-metal foil contacts the planar core substrate, the method comprising:

laminating said resin-metal foil on said planar core substrate while opposing the resin layer side of said resin-metal foil to a side of said planar core substrate;

bringing a flat metal plate portion of a buffer structure, said buffer structure formed by laminating a flat metal plate and a planar buffer member, into contact with the surface of said resin-metal foil on which a resin layer is not formed; and pressing said resin-metal foil against said planar core substrate by applying pressure on said planar buffer member in said buffer structure, wherein said planar buffer member is disposed parallel to said resin-metal foil with said metal plate between, a ratio of the length of one side of said buffer member to the length of one corresponding side of said resin-metal foil falls within the range of 92% to 104%, said flat metal plate brought into contact with the resin-metal foil having a larger surface area than a surface area of the surface of said resin-metal foil on which a resin layer is not formed, and an area of said flat metal plate corresponding to an edge of said resin-metal foil is unobstructed by the buffer on a side contacting the buffer and is moveable in a direction opposite to which the buffer presses the metal plate upon receipt of force from said edge of said resin-metal foil.

6. A laminated substrate manufacturing method according to claim 5, wherein a center of said resin-metal foil and a center of said buffer member substantially coincide with each other with respect to a direction of lamination.

* * * * *